United States Patent
Zhao et al.

(10) Patent No.: US 11,417,529 B2
(45) Date of Patent: Aug. 16, 2022

(54) PLASMA-BASED EDGE TERMINATIONS FOR GALLIUM NITRIDE POWER DEVICES

(71) Applicants: Yuji Zhao, Chandler, AZ (US); Houqiang Fu, Tempe, AZ (US); Kai Fu, Tempe, AZ (US)

(72) Inventors: Yuji Zhao, Chandler, AZ (US); Houqiang Fu, Tempe, AZ (US); Kai Fu, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 17/072,622

(22) Filed: Oct. 16, 2020

(65) Prior Publication Data

US 2021/0202257 A1    Jul. 1, 2021

Related U.S. Application Data

(60) Provisional application No. 62/924,410, filed on Oct. 22, 2019.

(51) Int. Cl.
| | |
|---|---|
| *H01L 29/00* | (2006.01) |
| *H01L 21/30* | (2006.01) |
| *H01L 23/58* | (2006.01) |
| *H01L 29/66* | (2006.01) |
| *H01L 29/861* | (2006.01) |
| *H01L 21/324* | (2006.01) |
| *H01L 29/20* | (2006.01) |

(52) U.S. Cl.
CPC ...... *H01L 21/3006* (2013.01); *H01L 21/3245* (2013.01); *H01L 23/585* (2013.01); *H01L 29/2003* (2013.01); *H01L 29/66136* (2013.01); *H01L 29/66204* (2013.01); *H01L 29/861* (2013.01)

(58) Field of Classification Search
CPC ............. H01L 21/3006; H01L 21/3245; H01L 29/2003; H01L 29/66136; H01L 29/66204; H01L 29/861; H01L 29/8611; H01L 23/585
See application file for complete search history.

(56) References Cited

PUBLICATIONS

Fu et al., "High Performance Vertical GaN-on-GaN p-n Power Diodes With Hydrogen-Plasma Based Edge Termination", Jul. 2018, IEEE Electron Device Letters, vol. 39, No. 7, pp. 1018-1021. (Year: 2018).*

A. M. Fischer, S. Srinivasan, F. A. Ponce, B. Monemar, F. Bertram, and J. Christen, "Time-resolved cathodoluminescence of Mg-doped GaN," Appl. Phys. Lett., Oct. 13, 2008, 93, 151901-1-151901-3 (4 pages).

(Continued)

*Primary Examiner* — Reema Patel
(74) *Attorney, Agent, or Firm* — Fish & Richardson P.C.

(57) ABSTRACT

A p-n diode includes a first electrode, a n-GaN layer on the first electrode, a p-GaN layer on the n-GaN layer, and a second electrode on a first portion of the p-GaN layer. A region of the p-GaN layer surrounding the electrode is a passivated region. Treating a GaN power device having a p-GaN layer includes covering a portion of the p-GaN layer with a metal layer, exposing the p-GaN layer to a hydrogen plasma, and thermally annealing the p-GaN layer, thereby passivating a region of the p-GaN layer proximate the metal layer.

10 Claims, 3 Drawing Sheets

(56) References Cited

PUBLICATIONS

A. M. Ozbek and B. J. Baliga, "Planar nearly ideal edge-termination technique for GaN devices," IEEE Electron Device Lett., vol. 32, No. 3, pp. 300-302, Mar. 2011, doi: 10.1109/LED.2010.2095825.

A. Salemi, H. Elahipanah, K. Jacobs, C.-M. Zetterling, and M. Östling, "15 kV-Class implantation-free 4H-SiC BJTs with record high current gain," IEEE Electron Device Lett., vol. 39, No. 1, pp. 63-66, Jan. 2018, doi: 10.1109/LED.2017.2774139.

A. V. Bolotnikov, P. G. Muzykov, Q. Zhang, A. K. Agarwal, and T. S. Sudarshan, "Junction termination extension implementing drive-in diffusion of boron for high-voltage SiC devices," IEEE Trans. Electron Devices, vol. 57, No. 8, pp. 1930-1935, Aug. 2010, doi: 10.1109/TED.2010.2051246.

B. J. Baliga, "Fundamentals of Power Semiconductor Devices," (Springer, Berlin, 2008), Chap. 3., 76 pages.

B. J. Baliga, "Silicon Carbide Power Devices," (World Scientific, Singapore, 2006), ch. 3, pp. 37-70.

B. Monemar et al., "Evidence for Two Mg Related Acceptors in GaN," Phys. Rev. Lett., Jun. 12, 2009, 102, 235501-1-235501-4.

B. S. Zheng, P. Y. Chen, C. J. Yu, Y. F. Chang, C. L. Ho, M. C. Wu, and K. C. Hsieh, "Suppression of current leakage along mesa surfaces in GaN-based p-i-n diodes," IEEE Electron Device Lett., vol. 36, No. 9, pp. 932-934, Sep. 2015, doi: 10.1109/LED.2015.2458899.

C. Gupta, S. H. Chan, Y. Enatsu, A. Agarwal, S. Keller, and U. K. Mishra, "OG-FET: An In-Situ Oxide, GaN Interlayer-Based Vertical Trench MOSFET," IEEE Electron Device Lett., Dec. 2016, 37(12): 1601-1604.

C. Gupta, Y. Enatsu, G. Gupta, S. Keller, and U. K. Mishra, "High breakdown voltage p-n diodes on GaN on sapphire by MOCVD," Phys. Status Solidi A, vol. 213, No. 4, pp. 878-882, Apr. 2016, doi: 10.1002/pssa.201532554.

C. H. Lin, Y. Yuda, M. H. Wong, M. Sato, N. Takekawa, K. Konishi, T. Watahiki, M. Yamamuka, H. Murakami, Y. Kumagai, and M. Higashiwaki, "Vertical Ga2O3 Schottky barrier diodes with guard ring formed by nitrogen ion implantation," IEEE Electron Device Lett., Sep. 2019, 1487-1490 doi: 10.1109/LED.2019.2927790.

C. Liu, R. A. Khaar, and E. Matioli, "GaN-on-Si Quasi-Vertical Power MOSFETs," IEEE Electron Device Lett., Jan. 2018, 39(1):71-74.

D. Alok and B. J. Baliga, "SiC device edge termination using finite area argon implantation," IEEE Trans. Electron Devices, vol. 44, No. 6, pp. 1013-1017, Jun. 1997, doi: 10.1109/16.585559.

D. Ji and S. Chowdhury, "Design of 1.2 kV Power Switches With Low Ron Using GaN-Based Vertical JFET," IEEE Trans. Electron Devices, Aug. 2015, 62(8):2571-2578.

D. Ji, A. Agarwal, H. Li, W. Li, S. Keller, and S. Chowdhury, "880 V/2.7 mΩ cm2 MIS Gate Trench CAVET on Bulk GaN Substrates," IEEE Electron Device Lett., Jun. 2018, 39(6):863-865.

D. Ji, C. Gupta, A. Agarwal, S. H. Chan, C. Lund, W. Li, S. Keller, U. K. Mishra, and S. Chowdhury, "Large-area in-situ oxide GaN interlayer-based vertical trench MOSFET (OG-FET)," IEEE Electron Device Lett., vol. 39, No. 5, pp. 711-714, May 2018, doi: 10.1109/LED.2018.2813312.

H. Chen, X. Huang, H. Fu, Z. Lu, X. Zhang, J. A. Montes, and Y. Zhao, "Characterizations of nonlinear optical properties on GaN crystals in polar, nonpolar, and semipolar orientations," Appl. Phys. Lett., vol. 110, No. 18, p. 181110, May 2017, doi: 10.1063/1.4983026.

H. Fu et al., "Nonpolar vertical GaN-on-GaN p-n diodes grown on free-standing (1010) m-plane GaN substrates," Appl. Phys. Express 11, Oct. 16, 2018, 111003-1-111003-5 (6 pages).

H. Fu, H. Chen, X. Huang, Z. Lu, and Y. Zhao, "Theoretical analysis of modulation doping effects on intersubband transition properties of semipolar AlGaN/GaN quantum well," J. Appl. Phys., Jan. 2017,121: 014501.

H. Fu, I. Baranowski, X. Huang, H. Chen, Z. Lu, J. Montes, X. Zhang, and Y. Zhao, "Demonstration of AlN Schottky barrier diodes with blocking voltage over 1 kV," IEEE Electron Device Lett., vol. 38, No. 9, pp. 1286-1289, Sep. 2017, doi: 10.1109/LED.2017.2723603.

H. Fu, K. Fu, H. Liu, S. R. Alugubelli, X. Huang, H. Chen, J. Montes, T. H. Yang, C. Yang, J. Zhou, F. A. Ponce, and Y. Zhao, "Implantation- and etching-free high voltage vertical GaN p-n diodes terminated by plasmahydrogenated p-GaN: revealing the role of thermal annealing," Appl. Phys. Express, vol. 12, No. 5, p. 051015, May 2019, doi: 10.7567/1882-0786/ab1813.

H. Fu, K. Fu, X. Huang, H. Chen, I. Baranowski, T.-H. Yang, J. Montes, and Y. Zhao, "High Performance Vertical GaN-on-GaN p-n Power Diodes With Hydrogen-Plasma-Based Edge Termination," IEEE Electron Device Lett., Jul. 2018, 39(7):1018-1021.

H. Fu, X. Huang, H. Chen, Z. Lu, I. Baranowski, and Y. Zhao, "Ultra-low turn-on voltage and on-resistance vertical GaN-on-GaN Schottky power diodes with high mobility double drift layers," Appl. Phys. Lett., vol. 111, No. 15, p. 152102, Oct. 2017, doi: 10.1063/1.4993201.

H. Fu, X. Huang, H. Chen, Z. Lu, X. Zhang, and Y. Zhao, "Effect of buffer layer design on vertical GaN-on-GaN p-n and Schottky power diodes," IEEE Electron Device Lett., vol. 38, No. 6, pp. 763-766, Jun. 2017, doi:10.1109/LED.2017.2690974.

H. Fu, Z. Lu, X. Huang, H. Chen, and Y. Zhao, "Crystal orientation dependent intersubband transition in semipolar AlGaN/GaN single quantum well for optoelectronic applications," J. Appl. Phys., vol. 119, No. 17, p. 174502, May 2016, doi: 10.1063/1.4948667.

H. Fu, Z. Lu, X. Zhao, Y. Zhang, S. P. DenBaars, S. Nakamura, and Y. Zhao, "Study of low efficiency droop in semipolar (20-2-1) InGaN light-emitting diodes by time-resolved photoluminescence," J. Display Technol., vol. 12, No. 7, pp. 736-741, Jul. 2016, doi:10.1109/JDT.2016.2521618.

H. Ohta, N. Kaneda, F. Horikiri, Y. Narita, T. Yoshida, T. Mishima, and T. Nakamura, "Vertical GaN p-n Junction diodes with high breakdown voltages over 4 kV," IEEE Electron Device Lett., vol. 36, No. 11, pp. 1180-1182, Nov. 2015, doi: 10.1109/LED.2015.2478907.

H. Sun et al., "Recent Advances on III-Nitride Nonowire Light Emitters on Foreign Substrates-Toward Flexible Photonics," Phys. Status Solidi, Oct. 24, 2018, 216(2):A1800420.

I. C. Kizilyalli, A. P. Edwards, H. Nie, D. Bour, T. Prunty, and D. Disney, "3.7 kV vertical GaN PN diodes," IEEE Electron Device Lett., vol. 35, No. 2, pp. 247-249, Feb. 2014, doi: 10.1109/LED.2013.2294175.

I. C. Kizilyalli, A. P. Edwards, H. Nie, D. Disney, and D. Bour, "High voltage vertical GaN p-n diodes with avalanche capability," IEEE Trans. Electron Devices, vol. 60, No. 10, pp. 3067-3070, Oct. 2013, doi: 10.1109/TED.2013.2266664.

I. C. Kizilyalli, A. P. Edwards, O. Aktas, T. Prunty, and D. Bour, "Vertical power p-n diodes based on bulk GaN," IEEE Trans. Electron Devices, vol. 62, No. 2, pp. 414-422, Feb. 2015, doi: 10.1109/TED.2014.2360861.

I. Shalish, L. Kronik, G. Segal, Y. Rosenwaks, Y. Shapira, U. Tisch, and J. Salzman, "Yellow Luminescence and related deep levels in unintentionally doped GaN films," Phys. Rev. B, Apr. 15, 1999, 59(15):9748-9751.

J. B. Limb, D. Yoo, J.-H. Ryou, W. Lee, S. C. Shen, and R. D. Dupuis, "High performance GaN pin rectifiers grown on free-standing GaN substrates," Electron. Lett., vol. 42, No. 22, pp. 1313-1314, Oct. 2006, doi: 10.1049/el:20062261.

K. Nomoto, B. Song, Z. Hu, M. Zhu, M. Qi, N. Kaneda, T. Mishima, T. Nakamura, D. Jena, and H. G. Xing, "1.7-kV and 0.55-m •cm2 GaN p-n diodes on bulk GaN substrates with avalanche capability," IEEE Electron Device Lett., vol. 37, No. 2, pp. 161-164, Feb. 2016, doi: 10.1109/LED.2015.2506638.

K. Nomoto, Y. Hatakeyama, H. Katayose, N. Kaneda, T. Mishima, and T. Nakamura, "Over 1.0 kV GaN p-n junction diodes on free-standing GaN substrates," Phys. Status Solidi A, vol. 208, No. 7, pp. 1535-1537, Jul. 2011, doi: 10.1002/pssa.201000976.

K. Nomoto, Z. Hu, B. Song, M. Zhu, M. Qi, R. Yan, V. Protasenko, E. Imhoff, J. Kuo, N. Kaneda, T. Mishima, T. Nakamura, D. Jena, and H. G. Xing, "GaN-on-GaN p-n power diodes with 3.48 kV and 0.95 m cm2: A record high figure-of-merit of 12.8 GW/cm2," in IEDM Tech. Dig., Dec. 2015, pp. 971-974, doi: 10.1109/IEDM.2015.7409665.

(56) References Cited

PUBLICATIONS

M. Qi, K. Nomoto, M. Zhu, Z. Hu, Y. Zhao, V. Protasenoko, B. Song, X. Yan, G. Li, J. Verma, S. Bader, P. Fay, H. G. Xing and D. Jena, "High breakdown single-crystal GaN p-n diodes by molecular beam epitaxy," Appl. Phys. Lett., vol. 107, No. 23, p. 232101, Dec. 2015, doi: 10.1063/1.4936891.

P. V. Zant, "Microchip Fabrication: A Practical Guide to Semiconductor Processing," (McGraw-Hill, USA, 2004) 5th ed. Chap. 11., 32 pages.

R. A. Khadar, C. Liu, L. Zhang, P. Xiang, K. Cheng, and E. Matioli, "820-V GaN-on-Si quasi-vertical PiN diodes with BFOM of 2.0 GW/cm2," IEEE Electron Device Lett., vol. 39, No. 3, pp. 401-404, Mar. 2018, doi: 10.1109/LED.2018.2793669.

R. Ghandi, B. Buono, M. Domeij, C.-M. Zetterling, and M. Östling, "High-voltage (2.8 kV) implantation-free 4H-SiC BJTs with long-term stability of the current gain," IEEE Trans. Electron Devices, vol. 58, No. 8, pp. 2665-2669, Aug. 2011, doi: 10.1109/TED.2011.2154332.

R. Ghandi, B. Buono, M. Domeij, G. Malm, C.-M. Zetterling, and M. Östling, "High-Voltage 4H-SiC PiN Diodes with Etched Junction Termination Extension," IEEE Electron Device Lett., Nov. 2009, 30(11): 1170-1172.

R. Hao, K. Fu, G. Yu, W. Li, J. Yuan, L. Song, Z. Zhang, S. Sun, X. Li, Y. Cai, X. Zhang, and B. Zhang, "Normally-off p-GaN/AlGaN/GaN high electron mobility transistors using hydrogen plasma treatment," Appl. Phys. Lett., vol. 109, p. 152106, Oct. 2016, doi: 10.1063/1.4964518.

R. Hao, N. Xu, G. Yu, L. Song, F. Chen, J. Zhao, X. Deng, X. Li, K. Cheng, K. Fu, Y. Cai, X. Zhang, and B. Zhang, "Studies on fabrication and reliability of GaN high-resistivity-cap-layer HEMT," IEEE Trans. Electron Devices, vol. 65, No. 4, pp. 1314-1320, Apr. 2018, doi: 10.1109/TED.2018.2803521.

R. Hao, W. Li, K. Fu, G. Yu, L. Song, J. Yuan, J. Li, X. Deng, X. Zhang, Q. Zhou, Y. Fan, W. Shi, Y. Cai, X. Zhang, and B. Zhang, "Breakdown enhancement and current collapse suppression by highresistivity GaN cap layer in normally-off AlGaN/GaN HEMTs," IEEE Electron Device Lett., vol. 38, No. 11, pp. 1567-1570, Nov. 2017, doi: 10.1109/LED.2017.2749678.

R. Juday, A. M. Fischer, Y. Huang, J. Y. Huang, H. J. Kim, J.-H. Ryou, R. D. Dupuis, D. P. Bour, and F. A. Ponce, "Hydrogen-related, deeply bound excitons in Mg-doped GaN films," Appl. Phys. Lett., Aug. 19, 2013, 103, 082103-1-082103-5 (6 pages).

S. Chowdhury et al., "Lateral and Vertical Transistors Using the AlGaN/GaN Heterostructure," IEEE Trans. Electron Devices, Oct. 2013, 60(10): 3060-3066.

S. Han, S. Yang, and K. Sheng, "High-voltage and high-ION/IOFF vertical GaN-on-GaN Schottky varrier diode with nitridation-based termination," IEEE Electron Device Lett., vol. 39, No. 4, pp. 572-575, Apr. 2018, doi:10.1109/LED.2018.2808684.

S. M. Sze and K. K. Ng, Physics of Semiconductor Devices, 3rd ed., John Wiley & Sons, Inc., Hoboken, NJ, USA: Wiley-Interscience, 2007, ch. 3, pp. 181-184.

S. Mase, T. Hamada, J. J. Freedsman, and T. Egawa, "Effect of drift Layer on the breakdown voltage of fully-vertical GaN-on-Si p-n diodes," IEEE Electron Device Lett., vol. 38, No. 12, pp. 1720-1723, Dec. 2017, doi:10.1109/LED.2017.2765340.

S. Nakamura, N. Iwasa, M. Senoh, and T. Mukai, "Hole compensation mechanism of p-type GaN films," Jpn. J. Appl. Phys., vol. 31, No. 5A, pp. 1258-1266, Feb. 1992, doi: 10.1143/JJAP.31.1258.

S. Nakamura, T. Mukai, M. Senoh, and N. Iwasa, "Thermal Annealing Effects on P-Type Mg-Doped GaN Films," Jpn. J. Appl. Phys., Feb. 15, 1992, vol. 31 part 2, No. 2B, L139-L142 (5 pages).

S. R. Alugubelli, H. Fu, K. Fu, H. Liu, Y. Zhao, and F. A. Ponce, "Dopant profiling in p-i-n GaN structures using secondary electrons," J. Appl. Phys., vol. 126, No. 1, p. 015704, Jul. 2019, doi: 10.1063/1.5096273.

T. Tanabe, and M. Kiyama, "High-breakdown-voltage pn-junction diodes on GaN substrates," J. Cryst. Growth, vol. 298, pp. 875-878, Jan. 2007, doi: 10.1016/j.jcrysgro.2006.10.246.

T.-T. Kao, J. Kim, T.-C. Lee, M.-H. Ji, T. Detchprohm, R. D. Dupuis, and S.-C. Shen, "Homojunction GaN p-i-n rectifiers with ultralow on-state resistance," in Proc. CS Mantech Conf., pp. 157-160, May 2014, doi:N/A.

W. Sung, E. V. Brunt, B. J. Baliga, and A. Q. Huang, "A new edge termination technique for high-voltage devices in 4H-SiC-multiplefloating-zone junction termination extension," IEEE Electron Device Lett., vol. 32, No. 7, pp. 880-882, Jul. 2011, doi: 10.1109/LED.2011.2144561.

X. A. Cao, H. Lu, S. F. LeBoeuf, C. Cowen, S. D. Arthur, and W. Wang, "Growth and characterization of GaN PiN rectifiers on freestanding GaN," Appl. Phys. Lett., vol. 87, No. 5, p. 053503-1-053503-3, Jul. 2005, doi: 10.1063/1.2001738.

X. Huang, H. Fu, H. Chen, X. Zhang, Z. Lu, J. Montes, M. Iza, S. P. DenBaars, S. Nakamura, and Y. Zhao, "Nonpolar and semipolar InGaN/GaN multiple-quantum-well solar cells with improved carrier collection efficiency," Appl. Phys. Lett., vol. 110, No. 16, p. 161105, Apr. 2017, doi: 10.1063/1.4980139.

X. Zou, X. Zhang, X. Lu, C. W. Tang, and K. M. Lau, "Fully vertical GaNp-i-n diodes using GaN-on-Si epilayers," IEEE Electron Device Lett., vol. 37, No. 5, pp. 636-639, May 2016, doi: 10.1109/IEDM.2015.7409830.

Y. Hatakeyama, K. Nomoto, A. Terano, N. Kaneda, T. Tsuchiya, T. Mishima, and T. Nakamura, "High-breakdown-voltage and low-Specificon-resistance GaN p-n junction diodes on free-standing GaN substrates fabricated through low-damage field-plate process," Jpn. J. Appl. Phys., vol. 52, No. 2R, p. 028007, Feb. 2013, doi: 10.7567/JJAP.52.028007.

Y. Okamoto, M. Saito, and A. Oshiyama, "First-Principles Calculations on Mg Impurity and Mg—H Complet in GaN," Jpn. J. Appl. Phys., Jul. 1996, vol. 35 part 2, No. 7A, L807-L809.

Y. Wang, X. Wang, B. Zhu, Z. Shi, J. Yuan, X. Gao, Y. Liu, X. Sun, D. Li, and H. Amano, "Full-duplex light communication with a monolithic multicomponent system," Light Sci. Appl., 2018, 7(83), 7 pages.

Y. Wu, D. Kapolnek, J. P. Ibbetson, P. Parikh, B. P. Keller, and U. K. Mishra, "Very-high power density AlGaN/GaN HEMTs," IEEE Trans. Electron Devices, vol. 48, No. 3, pp. 586-590, Mar. 2001, doi:10.1109/16.906455.

Y. Yoshizumi, S. Hashimoto, T. Tanade, and M. Kiyama, "High-breakdown-voltage pn-junction diodes on GaN substrates," J. Cryst. Growth, Jan. 2007, 298:875-878.

Y. Zhang, A. Dadgar, and T. Palacios, "Gallium nitride vertical power devices on foreign substrates: a review and outlook," J. Phys. D: Appl. Phys., vol. 51, No. 27, p. 273001, Jun. 2018, doi: 10.1088/1361-6463/aac8aa.

Y. Zhang, D. Piedra, M. Sun, J. Hennig, A. Dadgar, L. Yu, and T. Palacios, "High-performance 500 V quasi- and fully-vertical GaN-on-Si pn diodes," IEEE Electron Device Lett., vol. 38, No. 2, pp. 248-251, Feb. 2017, doi: 10.1109/LED.2016.2646669.

Y. Zhang, M. Sun, D. Piedra, J. Hu, Z. Liu, Y. Lin, X. Gao, K. Shepard, and T. Palacios, "1200 V GaN Vertical Fin Power Field-Effect Transistors," IEEE Int. Electron Devices Meeting (IEDM), 2017, 9.2.1-9.2.4.

Y. Zhang, M. Yuan, N. Chowdhury, K. Cheng, and T. Palacios, "720 V/0.35 mΩ•cm2 fully vertical GaN-on-Si power diodes by selective removal of Si substrates and buffer layers," IEEE Electron Device Lett., vol. 39, No. 5, pp. 715-718, May 2018, doi: 10.1109/LED.2016.2646669.

Y. Zhao, H. Fu, G. T. Wang, and S. Nakamura, "Toward ultimate efficiency: Progress and prospects on planar and 3D nanostructured nonpolar and semipolar InGaN light-emitting diodes," Adv. Opt. Photon., vol. 10, No. 1, pp. 246-308, Mar. 2018, doi: 10.1364/AOP.10.000246.

Z. Hu, K. Nomoto, M. Qi, W. Li, M. Zhu, X. Gao, D. Jena, and H. G. Xing, "1.1-kV vertical GaN p-n diodes with p-GaN regrown by molecular beam epitaxy," IEEE Electron Device Lett., vol. 38, No. 8, pp. 1071-1074, Aug. 2017, doi: 10.1109/LED.2017.2720747.

\* cited by examiner

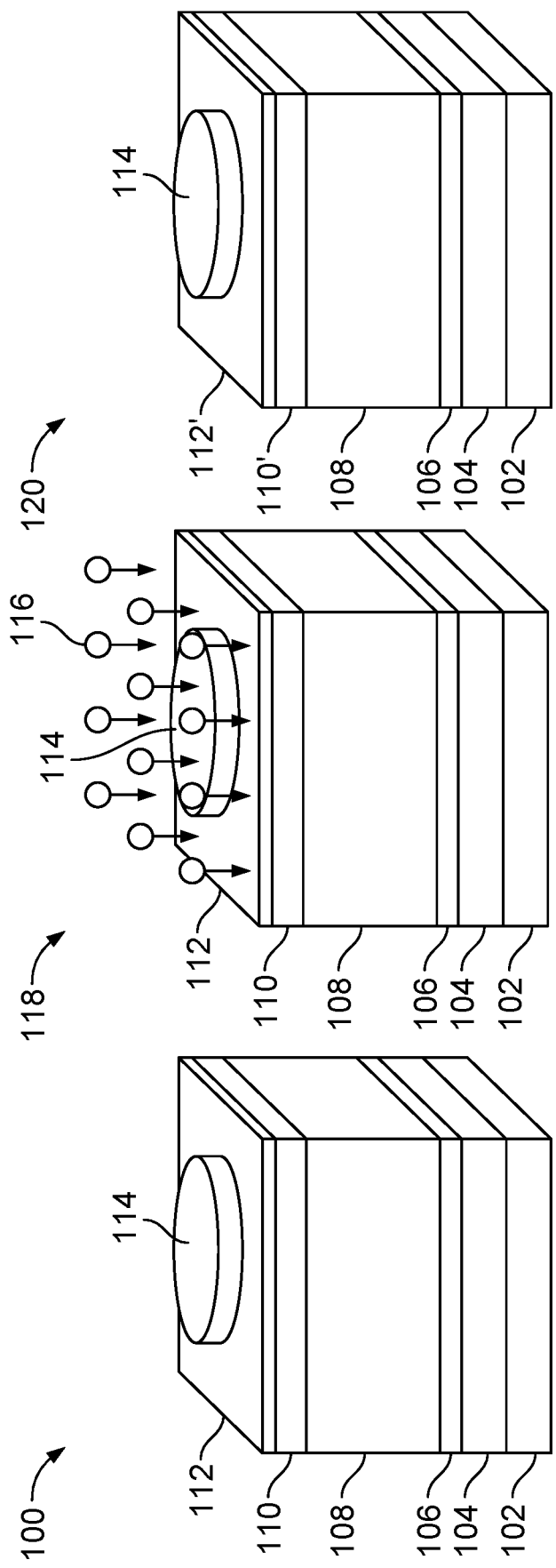

PLASMA-BASED EDGE TERMINATIONS FOR GALLIUM NITRIDE POWER DEVICES

CROSS-REFERENCE TO RELATED APPLICATION

This application claims the benefit of U.S. Application No. 62/924,410 entitled "PLASMA-BASED EDGE TERMINATIONS FOR GALLIUM NITRIDE POWER DEVICES" and filed on Oct. 22, 2019, which is incorporated herein by reference in its entirety.

STATEMENT OF GOVERNMENT INTEREST

This invention was made with government support under DE-AR0000868 awarded by the Department of Energy. The government has certain rights in the invention.

TECHNICAL FIELD

This invention relates to hydrogen-plasma-based edge termination (HPET) techniques for GaN power devices.

BACKGROUND

III-nitrides and their alloys have been used for a variety of applications in optoelectronics, photonics, and electronics. Due to GaN's large bandgap, high breakdown electric field (Eb), and large Baliga's figure of merit (BFOM), GaN-based power electronics have recently garnered interest for high-voltage, high-power, and efficient power conversion applications. Bulk GaN substrates have been used to homoepitaxially grow GaN epilayers with reduced defect densities for the fabrication of vertical GaN power devices. The vertical device geometry can handle larger voltages and currents with smaller chip area and have better capability for scaling and thermal management.

High voltage power diodes often demand termination techniques to mitigate the premature breakdown at the junction edge. Mesa etching has been used to terminate and/or isolate high voltage devices. However, this method can induce etching damages, and usually involves etching beveled mesa sidewalls with well-controlled angles or precise mesa steps, and/or designing sophisticated field plates (FP), which complicate the device fabrication process, increase the device capacitance, and cause reliability risks. Another method is to use ion-implantation to form a high-resistivity layer at the device edge by inducing mid-gap and/or compensating defects. However, this technique typically requires a high temperature post-implantation thermal annealing (e.g., ~1500° C.) to activate implanted atoms. This high temperature can lead to the decomposition of GaN. This process can also be disadvantageous due to the generation of detrimental defects and surface degradation resulting in unreliable device performance and increased fabrication costs.

SUMMARY

Hydrogen-plasma-based edge termination (HPET) techniques are described. These HPET techniques allow low-temperature, low-damage, plasma-based termination/isolation of GaN power diodes. These techniques can enable an implantation-free and etching-free fabrication process for high voltage GaN devices, and can be realized by inductively coupled plasma (ICP) tools, thereby reducing costs and simplifying device fabrication of high performance GaN p-n diodes.

The HPET techniques provide advantages over traditional ion-implantation techniques, which typically require annealing temperatures over 1000° C., which can decompose GaN. Ion-implantation can also result in damage due to ion-bombardment, which can cause reliability issues. Mesa-etching based edge termination can induce etching damages, and typically involves etching beveled mesa sidewalls with well-controlled angles or precise mesa steps, and/or designing sophisticated field plates (FP), which can complicate the device fabrication process, increase the device capacitance, and cause reliability risks. In contrast, the HPET techniques are low-temperature, low-damage, and low cost compared with these techniques, and offer improved device performance.

Low-damage, low-temperature, and easy-to-implement hydrogen-plasma-based termination is attractive for fabricating implantation- and etching free GaN power p-n diodes. A subsequent thermal annealing can thermally drive down hydrogen to hydrogenate p-GaN to form the termination. Devices described herein demonstrated a specific on-resistance of 0.4 m$\Omega$ cm$^2$ and a breakdown voltage (BV) of ~1.4 kV. They also exhibited improved BV compared with mesa-etched devices.

Hydrogen-plasma-based guard rings (GRs) for high voltage vertical GaN p-n diodes grown on bulk GaN substrates by metalorganic chemical vapor deposition (MOCVD) are described. The GR structure can improve BVs and critical electric fields (Ec) of the devices. Not having field plates or passivation, p-n diodes with a 9 µm drift layer and 10 GRs showed BV/on-resistance ($R_{on}$) of 1.70 kV/0.65 m$\Omega \times$cm$^2$, close to the GaN theoretical limit. Moreover, the devices also exhibited good rectifying behaviors with an on-current of ~2.6 kA/cm$^2$, an on/off ratio of about 10$^{10}$, and a turn-on voltage of 3.56 V. Effective guard ring techniques for high performance kV-class GaN p-n diodes are described.

In a first general aspect, treating a GaN power device having a p-GaN layer includes covering a portion of the p-GaN layer with a metal layer, exposing the p-GaN layer to a hydrogen plasma, and thermally annealing the p-GaN layer, thereby passivating a region of the p-GaN layer proximate the metal layer.

Implementations of the first general aspect may include one or more of the following features.

The GaN power device can include a GaN p-n diode. In some cases, thermally annealing the p-GaN layer includes heating the p-GaN layer to a temperature in a range between about 350° C. and about 500° C. In certain cases, passivating the p-GaN layer includes passivating substantially all of the p-GaN layer into highly resistant-GaN (HR-GaN). The HR-GaN can be an edge termination for the GaN power device.

An implementation of the first general aspect includes covering an additional portion of the p-GaN layer with an additional metal layer separated from the metal layer on a surface of the p-GaN layer, where thermally annealing the p-GaN layer includes passivating a region of the p-GaN layer between the metal layer and the additional metal layer. The metal layer can be in the form of a metal circle, and the additional metal layer can be a metal ring surrounding the circle. Passivating the region of the p-GaN layer proximate the metal layer can include passivating a region between the metal circle and the metal ring. The region between the metal circle and the metal ring can be a guard ring. A width of the guard ring is typically in a range between about 3 µm and about 10 μm. Some implementations include additional guard rings, with a spacing between two of the guard rings in a range between about 0.5 μm and about 2 μm.

In a second general aspect, a p-n diode includes a first electrode, an n-GaN layer on the first electrode, a p-GaN layer on the n-GaN layer, and a second electrode on a first portion of the p-GaN layer. A region of the p-GaN layer surrounding the electrode is a passivated region.

Implementations of the second general aspect may include one or more of the following features.

The p-n diode may include a metal ring on the p-GaN layer surrounding the second electrode. The region of the p-GaN layer is between the second electrode and the metal ring is the passivated region. The p-n diode may further include an additional metal on the p-GaN layer, where the additional metal ring surrounds the metal ring. In some cases, the region of the p-GaN layer between the metal ring and the additional metal ring is an additional passivated region. In certain cases, a region of the p-GaN layer between the second electrode and the n-GaN layer is not passivated. The region of the p-GaN layer may extend to the n-GaN layer. The passivated region can be an edge termination for the GaN power device.

The details of one or more embodiments of the subject matter of this disclosure are set forth in the accompanying drawings and the description. Other features, aspects, and advantages of the subject matter will become apparent from the description, the drawings, and the claims.

BRIEF DESCRIPTION OF DRAWINGS

FIGS. 1A-1C depict of samples with no treatment, with inductively coupled plasma (ICP) treatment, with ICP and rapid thermal anneal (RTA) treatments, and mesa etched p-n diodes, respectively.

DETAILED DESCRIPTION

Figure 2A:
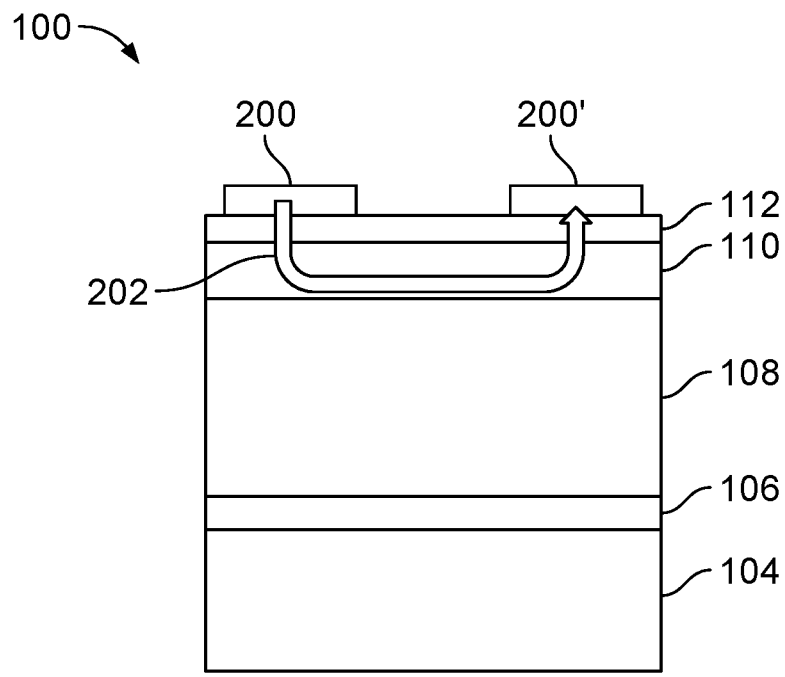
FIG. 2A depict a current conduction path in p-GaN.

In hydrogen ($H_2$)-plasma-based edge termination (HPET) for GaN p-n diodes, hydrogen forms stable Mg—H neutral complexes with Mg acceptors, and passivates p-GaN. Edge terminations allow high voltage power devices to avoid premature breakdown at the device edge. GaN power devices with the HPET show improvements in reverse leakage currents and breakdown voltages. These plasma based edge termination techniques, which are reliable, low-temperature, low-damage, cost-effective, and easy-to-implement, can effectively passivate p-GaN into high-resistivity GaN, serving as the termination/isolation in devices. This method may also be utilized in GaN transistors for various purposes such as passivation and termination/isolation. In this $H_2$-plasma-based termination/isolation technique, the plasma treatment is usually followed by a thermal annealing process. As described herein, plasma treatment deposits hydrogen atoms near the p-GaN surface, and thermal annealing is responsible for thermally driving down these atoms to fully hydrogenate p-GaN. With both treatments, BV of ~1.4 kV, a $R_{sp}$ of 0.4 mΩ cm$^2$, and a BFOM of ~5.0 GWcm$^{-2}$ in the vertical p-n diodes were observed.

FIGS. 1A-1C show the progression of a vertical GaN p-n diode treated with plasma hydrogenation and followed by rapid thermal annealing (RTA). In FIG. 1A, vertical GaN p-n diode 100 includes cathode 102, substrate 104 (e.g., n$^+$-GaN), buffer 106 (e.g., n$^+$-GaN), unintentionally doped (UID) GaN 108, p-GaN 110, p$^+$-GaN 112, and anode 114. In one example, anode 114 is a Pd/Ni/Au stack deposited by electron beam evaporation and subsequently annealed (e.g., at 450° C.) in nitrogen ambient by RTA. In another example, cathode 102 is a Ti/Al/Ti/Au stack evaporated on the backside of the wafer by electron beam evaporation.

FIG. 1B depicts treatment of vertical GaN p-n diode 100 with hydrogen ($H_2$) plasma 116 to yield ICP treated vertical GaN p-n diode 118. $H_2$ plasma 116 can be generated by an inductively coupled plasma (ICP) system. Anode 114 can serve as a self-aligned mask such that the portion of the p-GaN under the anode is not exposed to the $H_2$ plasma, while the remaining portion of the p-GaN area is exposed to the $H_2$ plasma. The ICP treatment alone typically only deposits H atoms near the exposed p-GaN surface.

FIG. 1C depicts ICP/RTA treated vertical GaN p-n diode 120 after rapid thermal annealing (RTA) (e.g., at 400° C.) of ICP treated vertical GaN p-n diode 118. The RTA thermally drives hydrogen down into p-GaN 110 and p$^+$-GaN 112 to yield hydrogenated p-GaN 110' and hydrogenated p$^+$-GaN 112'.

Figure 2B:
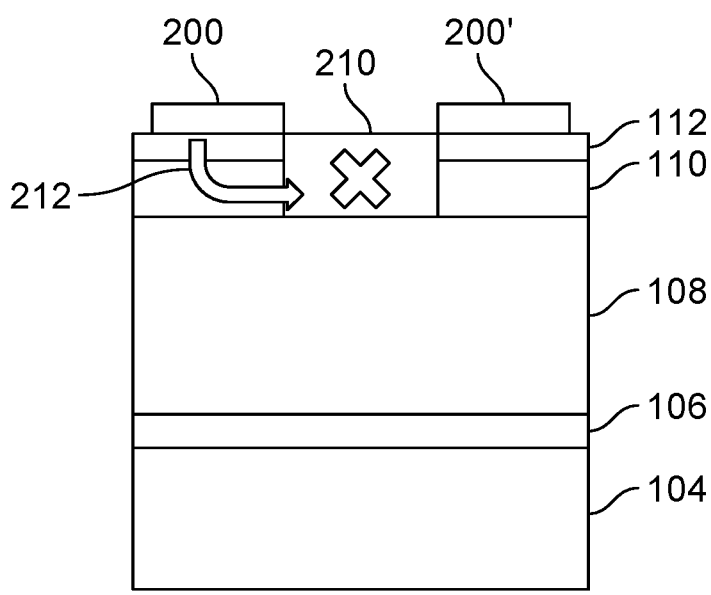
FIG. 2B shows the current conduction path cut off in hydrogenated p-GaN.

Plasma hydrogenation of p-GaN, as discussed with respect to FIGS. 1A-1C results in formation of stable Mg—H neutral complexes with Mg acceptors in the p-GaN, and passivates the p-GaN. FIGS. 2A and 2B depict conduction paths in devices with and without ICP/RTA treatment as described with respect to FIGS. 1A-1C. FIG. 2A depicts a portion of vertical GaN p-n diode 100 from FIG. 1A (no ICP/RTA) with ohmic contacts 200, 200' formed on p$^+$-GaN 112. Current conduction path 202 depicts the flow of current from ohmic contact 200 to ohmic contact 200' through p-GaN 110. FIG. 2B depicts ICP/RTA treated vertical GaN p-n diode 120 from FIG. 1C with ohmic contacts 200, 200' formed on p$^+$-GaN 112. Region 210 between ohmic contacts 200, 210 corresponds to hydrogenated p-GaN 110' and hydrogenated p$^+$-GaN 112' of FIG. 1C. Current conduction path 212 terminates at region 210, depicting the termination/isolation afforded by the hydrogenated p-GaN 110' and hydrogenated p$^+$-GaN 112' thereby decreasing leakage current and increasing breakdown voltage (BV).

Thus, RTA following ICP thermally drives hydrogen downward through the p$^+$-GaN and p-GaN, thereby hydrogenating the p$^+$-GaN and p-GaN to form hydrogenated (or passivated) regions between regions of p$^+$-GaN and p-GaN not subjected to ICP (e.g., regions between cathodes 114). These hydrogenated (or passivated) regions provide termination, isolation, or both for ICP/RTA treated vertical GaN p-n diode 120. With both plasma and thermal annealing treatments, a BV of ~1.4 kV and a $R_{sp}$ of 0.4 mΩ cm$^2$ can be obtained with high on-current, high on/off ratio, and low reverse leakage current. The devices also show good rectifying behaviors at high temperatures. The BV is also enhanced compared to mesa-etched p-n diodes. This described termination/isolation technique can reduce the fabrication complexity and costs and increase yield and reliability due to low-damage and low-temperature fabrication processes.

EXAMPLES

Example 1

GaN p-n diode epilayers were homoepitaxially grown on n$^+$-GaN bulk substrates by metalorganic chemical vapor deposition (MOCVD). The growth was initiated with a 1 µm thick n$^+$-GaN buffer layer, followed by a 9 µm unintentionally doped (UID) GaN drift layer and a 0.5 µm p-GaN layer ([Mg]=10$^{19}$ cm$^{-3}$), and finished with a thin p$^+$-contact layer. The source materials for Ga and N were trimethylgallium (TMGa) and ammonia (NH$_3$), respectively. The precursors for n-type and p-type dopants were silane (SiH$_4$) and bis(cyclopentadienyl)magnesium (Cp$_2$Mg), respectively. High resolution X-ray diffraction was used to characterize the crystal quality of the epilayers, where the full width at half maximum (FWHM) were 53 arcsec and 21 arcsec, respectively. The dislocation density of the epilayers was estimated to be on the order of 10$^6$ cm$^{-2}$. The net carrier concentration ND of the UID-GaN drift layer was ~5×10$^{15}$ cm$^{-3}$ obtained by the capacitance-voltage (C-V) measurement.

The anode was a Pd/Ni/Au metal stack (120 µm diameter) deposited by electron beam evaporation and subsequently annealed at 450° C. in nitrogen ambient by rapid thermal annealing (RTA). The Ti/Al/Ti/Au cathode was evaporated on the backside of the wafer by electron beam evaporation. To reveal the role of thermal annealing, different treatments were performed on these samples. Some samples had no additional treatments serving as the reference (e.g. as shown in FIG. 1A). Some samples were subject to H$_2$ plasma (e.g., as shown in FIG. 1B) generated by the inductively coupled plasma (ICP) system with an RF power of 10 W and an ICP power of 300 W. The anode serves as a self-aligned mask where the p-GaN under the anode is not exposed to the H$_2$ plasma, and other p-GaN area will be exposed. Some samples with the ICP treatment were further thermally treated by RTA at 400° C. (e.g., as shown in FIG. 1C). To reduce thermal damage and protect the contacts, the annealing temperature can be minimized. The effectiveness of the thermal annealing on the p-GaN passivation was probed by the currents between two ohmic contacts on the p-GaN after each annealing process.

The p-GaN region between the two contacts was exposed to the H$_2$ plasma treatment. If the exposed p-GaN is fully passivated, there will be no currents flowing between the two contacts. The minimum annealing temperature after which no currents were observed between the two p-GaN ohmic contacts (i.e., reaching the setup limit) was 400° C. For comparison, mesa-etched devices were also fabricated. The mesa etching with a depth of ~1.5 µm was realized by chlorine-based ICP dry etching. No passivation or FP were used for all samples. The electrical characteristics of the samples with different treatments were analyzed and compared. All electrical measurements were performed on a probe station. The forward and reverse current-voltage (I-V) characteristics were measured by a Keithley 2410 SourceMeter with a high current resolution (voltage limit: 1.1 kV). The breakdown measurements of the devices were carried out by a Tektronix 370 A curve tracer with a low current resolution (voltage limit: 2 kV) in Fluorinert electronic liquid FC-70 to prevent flash-over.

Cross-sectional scanning electron microscope (SEM) images of samples with different treatments were acquired with an FEI XL 30 SEM. No difference was observed between the samples with no treatment and with ICP treatment. The exposed p-GaN not covered by the anode did not seem to be affected by the H$_2$ plasma, showing a similar secondary electron (SE) contrast as the unexposed p-GaN layer. However, the sample with the ICP and RTA treatments showed a different cross-sectional image. The unexposed p-GaN under the anode remained unaffected, while the exposed p-GaN exhibited a darker SE contrast, similar to the underlying UID-GaN layer, indicating the passivation of Mg acceptors and the hydrogenation of p-GaN.

The optical properties of the as-grown and hydrogenated p-GaN were studied using cathodoluminescence (CL) spectroscopy at liquid helium temperature (4.6 K). The CL spectra of as-grown and hydrogenated p-GaN were recorded in raster scan mode using a JEOL 6300 SEM connected to a monochromator and photomultiplier tube. Two H-related peaks were observed, which have been attributed to H-related deeply-bound excitons (DBE) in p-GaN. The intensities were largely increased by hydrogenation, indicating that the hydrogenating process created H-related sites in the exposed p-GaN outside the anode. The donor-acceptor pair (DAP) peak and the neutral acceptor bound exciton (A$_2^0$X) peak were also observed. The acceptor involved in the A$_2^0$X transition is commonly attributed to Mg. The CL spectrum of hydrogenated p-GaN at 4.6 K spectrum was fitted with seven Gaussian peaks: A$_2^0$X at 3.433 eV, DBE1 at 3.386 eV, DBE2 at 3.357 eV, DAP1 at 3.265 eV with its two phonon replicas, and DAP2 at 3.150 eV. The two longitudinal optical (LO) phonon replicas were at 3.173 and 3.081 eV. The phonon replicas were restricted to have the same full width at half maximum (FWHM) as their zero phonon line emission. The separation between the phonon lines is 92 meV, corresponding to the LO phonon energy of GaN. Another DAP transition located near 3.150 eV was observed, and is frequently observed in low-temperature CL of Mg-doped GaN.

To further confirm the proposed role of thermal annealing, the forward and reverse electrical properties of the samples with different treatments were analyzed and compared. In linear scale, samples with different treatments showed similar rectifying behaviors with a turn-on voltage (V$_{on}$) of ~3.4 V. However, in semi-log scale, the sample with no treatment and ICP treatment had much higher leakage current before their turnon and lower on/off ratio than the sample with ICP and RTA treatments. This indicates that ICP treatment alone cannot typically form proper termination/isolation for these devices, consistent with the SEM and CL results. In addition, light emission from these samples, whose spectra were analyzed by a CCD spectrometer, was observed to yield three peaks: a near-bandgap-edge (NBE) emission peak, a DAP peak, and a yellow-luminescence (YL) peak related to the deep-level transition. The reverse leakage currents of the samples with different treatments was also compared. The samples with ICP and RTA treatments showed lower reverse leakage current than other samples due to the termination/isolation by the hydrogenated p-GaN. Samples with ICP treatment had a similar leakage current to the sample with no treatment, suggesting the impact of thermal annealing on the complete hydrogenation of p-GaN for high voltage GaN p-n diodes.

The reverse breakdown and forward characteristics of a sample with ICP and RTA treatments were assessed. The on-current reached ~5 kA cm$^{-2}$ and the R$_{sp}$ was 0.4 mΩ cm$^2$. The on/off ratio was ~10$^{10}$. The ideality factor of diodes can be calculated as a function of voltage by $$n = \frac{q}{2.3kT} \frac{1}{d\log(J)/dV},$$

where n is the ideality factor, k is the Boltzmann constant, T is temperature, and J is the current density. The minimum ideality factor was 1.6 at a bias of 2.8 V. Without passivation or FP, the device reached a BV of ~1.4 kV. The breakdown was due to the edge breakdown and resulted in permanent damage of the device, as visually confirmed by the optical microscopy. The BFOM was calculated to be ~5.0 GWcm$^{-2}$, which is close to the fundamental limit of GaN. Using the punch-through junction model, the breakdown electric field $E_b$ can be calculated by $$BV = E_b t - \frac{qN_D t^2}{2\varepsilon_0 \varepsilon_r},$$

where t is drift layer thickness. $E_b$ was estimated to be ~2.5 MV cm$^{-1}$. The electric field profile of the device was calculated according to the equation below.

$$dE/dt = -\frac{qN_D}{\varepsilon_0 \varepsilon_r}.$$

To investigate the thermal stability of the hydrogenated p-GaN, the I-Vs between two ohmic contacts on p-GaN with the ICP and RTA treatments were measured at different temperatures. Compared with the p-GaN, the hydrogenated p-GaN is highly resistive and stable up to 300° C. The high thermal stability of hydrogen in p-GaN is attributed to the strong bond between H and Mg acceptors in the Mg—H complexes. The temperature-dependent forward I-V characteristics of the sample with ICP and RTA treatments were assessed. The devices exhibited good rectifying behaviors even at 300° C. For $V_{on}$ and $R_{sp}$ measured as a function of temperature, the $V_{on}$ had a small decremental rate of 1.8 mV° C.$^{-1}$, where the reduction was due at least in part to the exponentially increasing diode diffusion current. The $R_{sp}$ slightly increased at a rate of 0.55 μΩ cm$^{2o}$ C.$^{-1}$ due to the enhanced phonon scattering and thus reduced carrier mobility at high temperatures. Reverse breakdown was measured at 25° C. and 75° C. BV at 75° C. do not show significant degradations compared with those at room temperature.

The forward and reverse I-V characteristics of the sample with ICP and RTA treatments were compared with commonly used mesa-etched p-n diodes. Both devices showed similar forward I-V characteristics. However, the devices with the mesa etching showed smaller BV of ~1 kV and $E_b$ of ~1.8 MV cm$^{-1}$. Mesa-etched devices usually use additional passivation layers and FPs for high voltage applications, complicating the fabrication process and increasing the costs. In contrast, without etching needed, the plasma-based termination/isolation technique typically ensures that the junction edge is intact. Using a relatively thin drift layer of 9 μm, the devices described herein with a simple termination technique achieved high performance close to the GaN limit. This method can simplify the fabrication processes, reduce parasitic effects and reliability issues, and cut down costs for high-power GaN p-n diodes.

Example 2

Figure 3A:
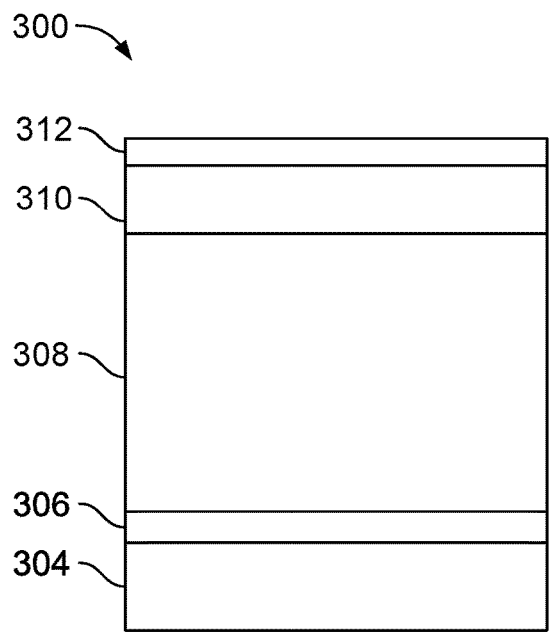
FIG. 3A depicts a cross-section of epilayers.

Devices were homoepitaxially grown on n$^+$-GaN bulk GaN substrates ([Si]>10$^{18}$ cm$^{-3}$) by metalorganic chemical vapor deposition (MOCVD). The Ga and N sources were trimethylgallium (TMGa) and ammonia (NH), respectively. The Si and Mg dopants were incorporated using the precursors silane (SiH$_4$) and bis(cyclopentadienyl)magnesium (Cp$_2$Mg), respectively. The growth temperature was about 1050° C. and the carrier gas was H$_2$. As depicted in FIG. 3A, device 300 includes 1-μm-thick n-GaN 306 ([Si]=2×10$^{18}$ cm$^{-3}$) grown on substrate 304, followed by a 9 μm n$^+$-GaN drift layer 308 ([Si]=2×10$^{16}$ cm$^{-3}$). Then the growth was finished with 500 nm p-GaN 310 ([Mg]=10$^{19}$ cm$^{-3}$) and 20 nm p$^+$-GaN 312 ([Mg]=10$^{20}$ cm$^{-3}$). The carrier concentration of the drift layer was about 10$^{16}$ cm$^{-3}$ according to capacitance-voltage (C-V) measurements. High resolution X-ray diffraction was used to characterize the crystal quality of the device epilayers using the PANalytical X-ray diffractometer system with Cu Kα radiation. A hybrid monochromator was employed for the incident beam optics, and triple axis module as the diffracted beam optics. The FWHM of (002) and (102) plane rocking curves were 53.2 and 44.9 arcsec, respectively. The dislocation density was estimated to be 3.4×10$^6$ cm$^{-2}$, indicating the high quality homoepitaxial layers.

The fabrication of vertical GaN p-n diodes was carried out using conventional photolithography. This process includes ultrasonic sample cleaning in acetone and isopropyl alcohol, followed by the simultaneous formation of anode and guard ring (GR) patterns by photolithography. Before metal depositions by the electron beam evaporation, the samples were treated in oxygen (O$_2$) plasma to remove any residual photoresists and then briefly dipped in diluted (1:3) hydrochloric acid (HCl) to remove native surface oxides. The anodes (diameter φ=100 μm) and metal rings for the GRs formation consisted of metal stacks of Pd/Ni/Au (20 nm/30 nm/150 nm) annealed by rapid thermal annealing (RTA) at 450° C. in N$_2$ ambient. The metal rings have a nominal width and spacing of 10 μm and 1.5 μm, respectively. The metal rings were formed at the same time as the anodes without additional photolithography steps, simplifying the fabrication process. The cathodes were non-alloyed metal stacks of Ti/Al/Ni/Au (20 nm/120 nm/30 nm/100 nm) at the backside of the samples.

Figure 3B:
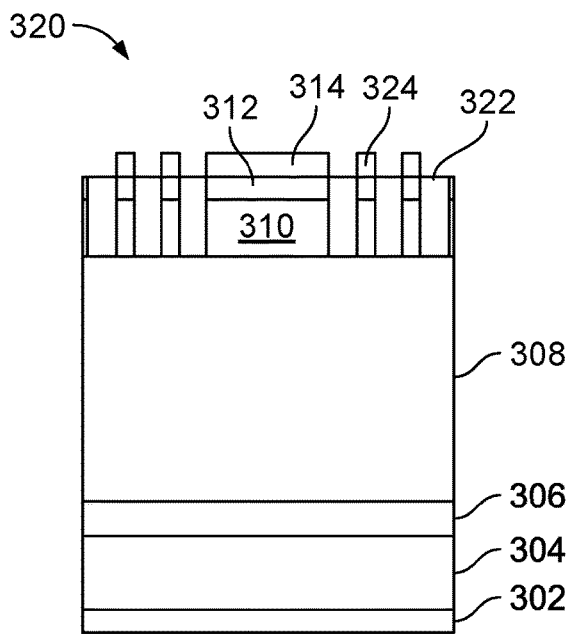
FIG. 3B depicts a cross-section of a device with guard rings (GRs).
Figure 3C:
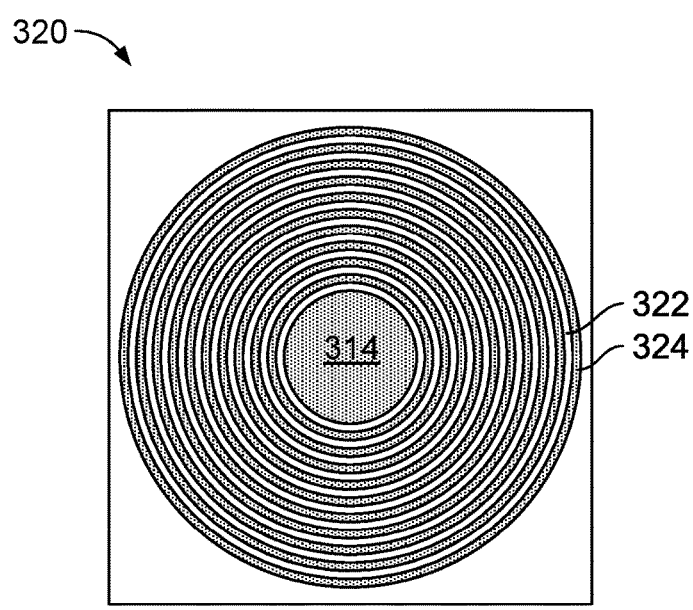
FIG. 3C is a top view of p-n diodes with 10 GRs.

To form GRs, the samples were loaded into the inductively coupled plasma (ICP) tool for H$_2$ plasma treatments where the metal rings served as hard masks. After thermal annealing by RTA at 400° C. in N$_2$ ambient, the exposed p-GaN regions were fully passivated by H and became highly resistive (HR) GRs. The ICP conditions were as follows: H$_2$ flow of 25 sccm, ICP power of 300 W, RF power of 5 W, and chamber pressure of 8 mTorr. FIG. 3B depicts a cross-section of the ICP/RTA vertical GaN p-n diode 320 having cathode 302, substrate 304, n$^+$-GaN 306, n-GaN 308, p-GaN 310, p$^+$-GaN 312, and anode 314, with GRs 322 formed between metal rings 324. Devices with 1, 5, and 10 metal rings, referred to as devices with 1, 5, and 10 GRs, respectively, were fabricated. FIG. 3C depicts a top view of ICP/RTA vertical GaN p-n diode 320 with 10 GRs 322 between metal rings 324. Scanning electron microscope (SEM) images show the p-GaN regions and the GR regions, with very different secondary electron (SE) contrasts. The SE emission from GR regions showed similar contrast to that of n$^-$-GaN, suggesting the deactivation of Mg acceptors. p-n diodes without metal rings were also fabricated for reference. Neither field plates (FPs) nor passivation was employed in these reference examples. Forward current-voltage (I-V) curves were measured by a Keithley 2400 sourcemeter. Breakdown measurements were conducted using Tektronix 370A curve tracer where the samples were immersed in Fluorinert FC-70 to avoid flash-over.

The forward I-V characteristics and ideality factors (n) of the reference p-n diodes and p-n diodes with 1 GR, 5 GRs, and 10 GRs in a linear scale were assessed. By linear extrapolation, the turn-on voltages ($V_{on}$) for the four samples were extracted as 3.50, 3.53, 3.59, and 3.56 V, respectively. The minimum n were 1.69, 1.65, 1.67, and 1.64 for the four samples, respectively. The n first decreased and then increased. The former was caused at least in part by the transition from the Shockley-Read-Hall (SRH) recombination current to the p-n diode diffusion current, and the latter was due at least in part to the series resistance. Forward I-V characteristics and the specific on-resistance ($R_{on}$) for the four samples in a semi-log scale were assessed. They had an on-current of ~2.6 kA/cm² and an on/off ratio of ~$10^{10}$. The $R_{on}$ of the four samples were 0.65, 0.63, 0.70, and 0.65 mΩ·cm², respectively. Furthermore, strong light emission was observed from all samples at high forward biases due to the radiative recombination in the p-n diode depletion region, which can indicate the high material quality of the devices. Electroluminescence (EL) analysis revealed 3.4 eV, 3.2 eV, and 2.2 eV emission peaks, which are due at least in part to band-edge emission, donor-acceptor pair transition, and deep level transition, respectively. These results show the p-n diodes with GRs have similar forward characteristics to the reference sample, which is desired and also good for the fair breakdown comparisons among these samples.

Breakdown voltages were assessed for the reference sample and the samples with 1 GR, 5 GRs and 10 GRs. The BV of the four samples were 1.08, 1.39, 1.58, and 1.70 kV, respectively. The breakdown capability of the GaN p-n diodes was enhanced by the addition of GRs. The BV of the devices was increased with the increasing number of GRs due at least in part to better distributed edge electric fields. $E_c$ is related to BV using the following equation $$BV = E_c d - \frac{eN_D d^2}{2\varepsilon_0 \varepsilon_r}$$

where e is the electron charge, d and ND are the thickness and carrier concentration of the drift layer, respectively, $\varepsilon_0$ is the permittivity of the vacuum, and $\varepsilon_r$ is the relative permittivity of GaN. Assuming that 75% of the entitled BV is achieved in the devices, the calculated $E_c$ of the four samples were 2.51, 2.97, 3.26, and 3.43 MV/cm, respectively. $E_c$ was increased with the increasing number of GRs, sharing a similar trend to the BV. The p-n diodes with 10 GRs exhibited the highest $E_c$ of 3.43 MV/cm. With the one-dimensional Poisson's equation, the electric field profiles of the samples were also calculated. Table I summarizes the device parameters for the four GaN p-n diodes. These results indicate employing the hydrogen-plasma based GRs is effective in enhancing the breakdown capability of GaN p-n diodes.

TABLE I

DEVICE PARAMETERS FOR THE FOUR GAN P-N DIODES

|  | n | $V_{on}$ (V) | $R_{on}$ (mΩcm²) | BV (kV) | $E_c$ (MV/cm) |
|---|---|---|---|---|---|
| Reference | 1.69 | 3.50 | 0.65 | 1.08 | 2.51 |
| 1 GR | 1.65 | 3.53 | 0.63 | 1.39 | 2.97 |
| 5 GRs | 1.67 | 3.59 | 0.70 | 1.58 | 3.26 |
| 10 GRs | 1.64 | 3.56 | 0.65 | 1.70 | 3.43 |

The performance of the devices of this example with GRs was close to the theoretical limit of GaN. It should be noted that these devices only had a drift layer thickness of 9 µm without FPs or passivation. The 1.70 kV/0.65 mΩ·cm² of the GaN p-n diodes with 10 GRs is comparable to the performance of devices with similar and/or thicker drift layer thicknesses. These results have demonstrated that with the simple hydrogen-plasma based GR structure, the performance of kV-class GaN p-n diodes can be improved.

Thus, the hydrogen-plasma based GR technique for vertical GaN p-n diodes of this example yields devices with enhanced BV and $E_c$. In addition, the devices also exhibited good forward characteristics with a $R_{on}$ of 0.65 mΩ cm² and an on/off ratio of about $10^{10}$. With a 9 µm drift layer and the GR technique, 1.70 kV/0.65 mΩ·cm² was achieved, which is close to the theoretical limit. These results indicate the hydrogen-plasma based GRs are effective for high performance kV-class GaN p-n diodes.

Although this disclosure contains many specific embodiment details, these should not be construed as limitations on the scope of the subject matter or on the scope of what may be claimed, but rather as descriptions of features that may be specific to particular embodiments. Certain features that are described in this disclosure in the context of separate embodiments can also be implemented, in combination, in a single embodiment. Conversely, various features that are described in the context of a single embodiment can also be implemented in multiple embodiments, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular embodiments of the subject matter have been described. Other embodiments, alterations, and permutations of the described embodiments are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Accordingly, the previously described example embodiments do not define or constrain this disclosure. Other changes, substitutions, and alterations are also possible without departing from the spirit and scope of this disclosure.

What is claimed is:

1. A method of treating a GaN power device comprising a p-GaN layer, the method comprising:
   covering a portion of the p-GaN layer with a metal layer;
   exposing the p-GaN layer to a hydrogen plasma;
   thermally annealing the p-GaN layer, thereby passivating a region of the p-GaN layer proximate the metal layer; and
   covering an additional portion of the p-GaN layer with an additional metal layer separated from the metal layer on a surface of the p-GaN layer,
   wherein thermally annealing the p-GaN layer comprises passivating a region of the p-GaN layer between the metal layer and the additional metal layer.

2. The method of claim 1, wherein thermally annealing the p-GaN layer comprises heating the p-GaN layer to a temperature in a range between 350° C. and 500° C.

3. The method of claim 1, wherein passivating the p-GaN layer comprises passivating all of the p-GaN layer into highly resistant-GaN (HR-GaN).

4. The method of claim 3, wherein the HR-GaN is an edge termination for the GaN power device.

5. The method of claim 1, wherein the metal layer is in the form of a metal circle, and the additional metal layer is a metal ring surrounding the circle.

6. The method of claim 5, wherein passivating the region of the p-GaN layer proximate the metal layer comprises passivating a region between the metal circle and the metal ring.

7. The method of claim 6, wherein the region between the metal circle and the metal ring is a guard ring.

8. The method of claim 7, wherein a width of the guard ring is in a range between 3 μm and 10 μm.

9. The method of claim 8, further comprising additional guard rings, and wherein a spacing between two of the guard rings is in a range between 0.5 μm and 2 μm.

10. The method of claim 1, wherein the GaN power device comprises a GaN p-n diode.

\* \* \* \* \*